United States Patent
Jeddeloh (10) Patent No.: US 8,583,870 B2
(45) Date of Patent: *Nov. 12, 2013

(54) STACKED MEMORY DEVICES, SYSTEMS, AND METHODS

(71) Applicant: Micron Technology, Inc., Boise, ID (US)

(72) Inventor: Joe M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/632,797

(22) Filed: Oct. 1, 2012

(65) Prior Publication Data

US 2013/0031303 A1   Jan. 31, 2013

Related U.S. Application Data

(63) Continuation of application No. 12/247,102, filed on Oct. 7, 2008, now Pat. No. 8,281,074.

(51) Int. Cl.
*G06F 12/08* (2006.01)

(52) U.S. Cl.
USPC .................................. 711/122; 711/E12.019

(58) Field of Classification Search
USPC ................... 711/118, 122, E12.016, E12.019
See application file for complete search history.

(56) References Cited

U.S. PATENT DOCUMENTS

| | | | |
|---|---|---|---|
| 6,567,889 B1 | 5/2003 | DeKoning et al. | |
| 6,789,169 B2 | 9/2004 | Jeddeloh | |
| 7,111,096 B1 | 9/2006 | Banning et al. | |
| 7,133,972 B2 | 11/2006 | Jeddeloh | |
| 7,188,217 B2 | 3/2007 | Jeddeloh | |
| 8,281,074 B2 | 10/2012 | Jeddeloh | |
| 2001/0044872 A1 | 11/2001 | Meyer | |
| 2002/0073280 A1 | 6/2002 | Ng | |
| 2003/0137540 A1 | 7/2003 | Klevenz et al. | |
| 2003/0229770 A1 | 12/2003 | Jeddeloh | |
| 2005/0238052 A1 | 10/2005 | Yamazaki | |
| 2006/0004957 A1 | 1/2006 | Hand, III et al. | |
| 2007/0058471 A1 | 3/2007 | Rajan et al. | |
| 2007/0094445 A1 | 4/2007 | Trika et al. | |
| 2007/0239938 A1 | 10/2007 | Pong | |
| 2008/0195801 A1 | 8/2008 | Cheon et al. | |
| 2008/0222367 A1 | 9/2008 | Co | |
| 2009/0103855 A1 | 4/2009 | Binkert et al. | |

(Continued)

FOREIGN PATENT DOCUMENTS

| WO | WO-2010042521 A2 | 4/2010 |
|---|---|---|
| WO | WO-2010042521 A3 | 7/2010 |

OTHER PUBLICATIONS

International Application Serial No. PCT/US2009/059701, Search Report mailed May 20, 2010, 3 pgs.

(Continued)

*Primary Examiner* — Hal Schnee
(74) *Attorney, Agent, or Firm* — Schwegman, Lundberg & Woessner, P.A.

(57) ABSTRACT

Memory requests for information from a processor are received in an interface device, and the interface device is coupled to a stack including two or more memory devices. The interface device is operated to select a memory device from a number of memory devices including the stack, and to retrieve some or all of the information from the selected memory device for the processor. Additional apparatus, systems and methods are disclosed.

25 Claims, 6 Drawing Sheets

(56) References Cited

U.S. PATENT DOCUMENTS

2009/0172288 A1    7/2009   Sukegawa
2009/0300280 A1   12/2009   Jutzi et al.
2010/0088460 A1    4/2010   Jeddeloh

OTHER PUBLICATIONS

International Application Serial No. PCT/US2009/059701, Written Opinion mailed May 20, 2010, 4 pgs.

"USB Flash Wear-Leveling and Life Span", Corsair, Frequently Asked Questions,, (Jun. 2007), 2 pages.

STACKED MEMORY DEVICES, SYSTEMS, AND METHODS

PRIORITY APPLICATION

This application is a continuation of U.S. application Ser. No. 12/247,102, filed Oct. 7, 2008, which is incorporated herein by reference in its entirety.

BACKGROUND

Information used by a processor is often stored in a memory system that includes a storage device and a cache memory. The processor will request information that is retrieved either from the cache memory or the storage device. The cache memory stores much less information than the storage device, but has a much shorter latency than the storage device. Latency is the time between initiating a request for information in a memory system and the moment the information is retrieved. The read operation is faster when there is a lower latency.

Retrieving the information directly from the cache memory substantially reduces latency for the processor. When the processor runs a particular software application, input/output (I/O) patterns in the information used by the processor tend to repeat. There is a good chance that information obtained from the storage device will be retrieved again. The cache memory stores information most recently accessed by the processor. When the processor requests information that is in the cache memory, the slower storage device does not need to be accessed and the information is retrieved directly from the faster cache memory. The cache memory reduces the number of times that information is retrieved from the storage device. The cache memory improves the performance of the memory system by reducing an average latency for information requested by the processor.

DETAILED DESCRIPTION

Systems including a processor and multiple memory devices typically have the processor decide which memory device is to provide information used by the processor. When the processor does not have this information, a page fault occurs and the operating system (OS) of the processor begins a disk I/O routine to retrieve the information. The disk I/O routine is software that selects one or more external memory devices storing the information and retrieves the information from the selected memory devices. The processor includes hardware to manage a transfer of the information from a cache memory device or a storage device to the processor. The disk I/O routine takes a substantial amount of time to retrieve the information.

The inventor has discovered that the challenge noted above, as well as others, can be addressed by performing a cache tag look-up routine in an interface device separate from a processor. The interface device is coupled between the processor and multiple memory devices to receive a memory request from the processor and to retrieve information for the processor from one or more of the memory devices. The memory request is a request for information stored in the memory devices. The information includes one or more of data, address and control information or other information. The memory devices include a stack of memory devices that operate as a cache memory. The interface device attempts to retrieve the information from the cache memory. If the information is not in the cache memory, the interface device retrieves it from a storage device such as a dual in-line memory module (DIMM) or a solid state disk. The processor and its OS are not involved in retrieving the information. The processor sees the interface device and the memory devices to be a single entity providing the information.

Figure 1:
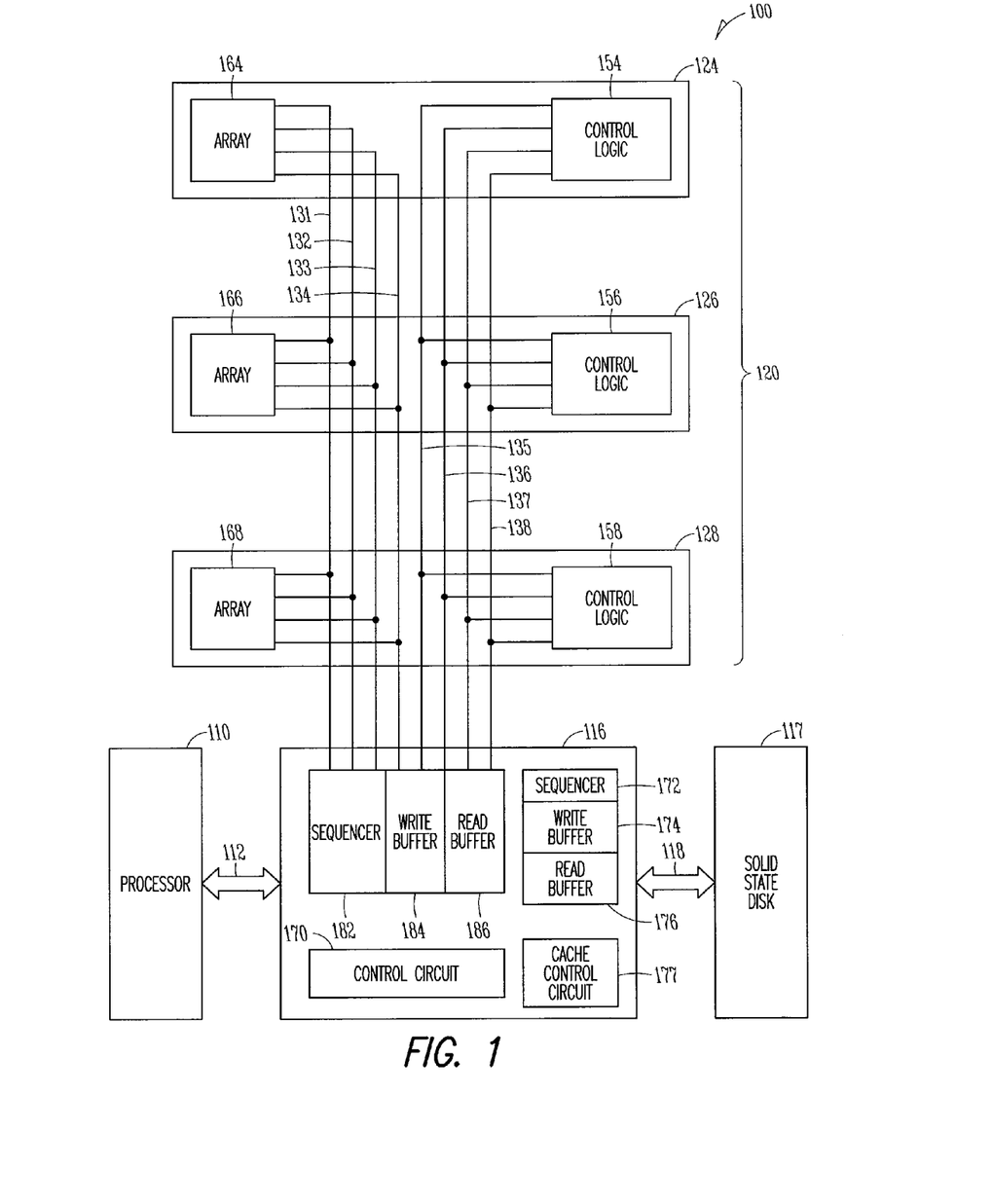
FIG. 1 is a block diagram of a system according to various embodiments of the invention.

FIG. 1 is a block diagram of a system 100 according to various embodiments of the invention. The system 100 includes a processor 110 coupled through a bus 112 to an interface device 116 and a solid state disk 117 coupled through a bus 118 to the interface device 116. The solid state disk 117 is a flash memory device. The system 100 also includes a stack 120 including IC dice and channels according to various embodiments of the invention. A stack of IC dice includes a collection of IC dice coupled together to exchange data, address and control signals. The stack 120 includes the interface device 116 and separate IC dice 124, 126 and 128, coupled to a number of channels 131, 132, 133, 134, 135, 136, 137 and 138 to transfer information. The stack 120 may include more channels. Each of the channels 131-138 may be an electrically conductive path to carry signals between the IC dice 124, 126 and 128 and the interface device 116. The channels 131-138 are also coupled to the interface device 116.

The interface device 116 is formed of semiconductor material with electronic circuitry including logic circuitry. Each of the IC dice 124, 126 and 128 is a memory device, such as a dynamic random access memory (DRAM) device, formed of semiconductor material with electronic circuitry that includes respective control logic circuits 154, 156 and 158 and respective arrays 164, 166 and 168 of memory cells. The IC dice 124, 126 and 128 may communicate with each other through the channels 131-138 and with the processor 110 through the interface device 116. Other devices such as the solid state disk 117 and other memory devices may be coupled to the interface device 116 to communicate with the processor 110 or the IC dice 124, 126 and 128.

The processor 110, the interface device 116 and the solid state disk 117 may be arranged on a circuit board having a planar surface extending in an X direction and a Y direction substantially orthogonal to the X direction. The channels 131-138 extend in a Z direction from the interface device 116 through or into the IC dice 124, 126 and 128, with the Z direction being substantially orthogonal to the X direction and the Y direction. The stack 120 may include more or fewer IC dice according to various embodiments of the invention.

Information exchanged between the processor 110 and the solid state disk 117 is controlled by a control circuit 170 in the interface device 116. The information includes one or more of data, address and control information or other information. Information exchanged on the bus 118 between the interface device 116 and the solid state disk 117 is controlled by a sequencer 172. The sequencer 172 generates addresses used to step through the exchange of information on the bus 118. A write buffer 174 in the interface device 116 stores information to be transmitted on the bus 118 and information received from the bus 118 is stored in a read buffer 176 in the interface device 116.

Information exchanged between the processor 110 and the IC dice 124, 126 and 128 is controlled by a cache control circuit 177 in the interface device 116. The information includes one or more of data, address and control information or other information. Information exchanged on the channels 131-138 between the interface device 116 and the IC dice 124, 126 and 128 is controlled by a sequencer 182. A write buffer 184 in the interface device 116 stores information to be transmitted on the channels 131-138 and information received from the channels 131-138 is stored in a read buffer 186 in the interface device 116.

The interface device 116, the solid state disk 117 and the IC dice 124, 126 and 128 are components of a tiered memory system in which the IC dice 124, 126 and 128 are operated as a cache memory and the solid state disk 117 is operated as a storage device. Other memory devices (not shown) such as a flash DIMM and a DRAM DIMM may be coupled to the interface device 116 as additional storage devices. The interface device 116 receives a memory request for information from the processor 110 and executes a cache tag look-up to retrieve the information and transmit it to the processor 110. The cache tag look-up is based on a 4KByte page address according to various embodiments of the invention.

The interface device 116 executes the cache tag look-up to determine if the information is in the stack 120 or one or more of the storage devices, and then to select the stack 120 and/or one or more of the storage devices if they do contain some of the information. The interface device 116 is operated to select the stack 120 and/or one or more of the storage devices having the shortest latency for the information. If at least a portion of the information is located in the stack 120, then some or all of the information is retrieved from the IC dice 124, 126 and 128. Some or all of the information is retrieved from one or more of the storage devices having the shortest latency such as the solid state disk 117 or the other memory devices if all of the information is not located in the stack 120. A disk I/O routine is not performed by the processor 110. The control of information exchanged between the processor 110, the IC dice 124, 126 and 128 and the solid state disk 117 through the interface device 116 will be described in more detail with reference to FIG. 2.

A logical block address (LBA) is an address used by an OS to locate a block of data stored in a flash memory device. A physical block address (PBA) is the physical address of the block of data in the flash memory device and may be different from the LBA. A LBA-to-PBA look-up table, also called a LBA table, is used to find the PBA for a LBA during a read or a write. Cache tag values correspond with addresses of blocks of data in storage devices that are currently copied to a cache memory device. The cache tag values indicate whether a block of data is stored in the cache memory device. Cache tag values or LBA tables, or both, may be stored in the IC dice 124, 126 and 128.

The IC dice 124, 126 and 128 may be partitioned into multiple types of memory including the cache memory according to various embodiments of the invention. The IC dice 124, 126 and 128 may include DRAM devices, flash memory devices, or a combination of flash memory devices and DRAM devices according to various embodiments of the invention. The stack 120 shown in FIG. 1 includes a specific number of channels as an example. The number of channels in the stack 120 may vary. For example, the stack 120 may include tens, hundreds, or thousands of channels extending through or into the IC dice 124, 126 and 128 in the stack 120. The channels enable high speed communication between the interface device 116 and the IC dice 124, 126 and 128.

Figure 2:
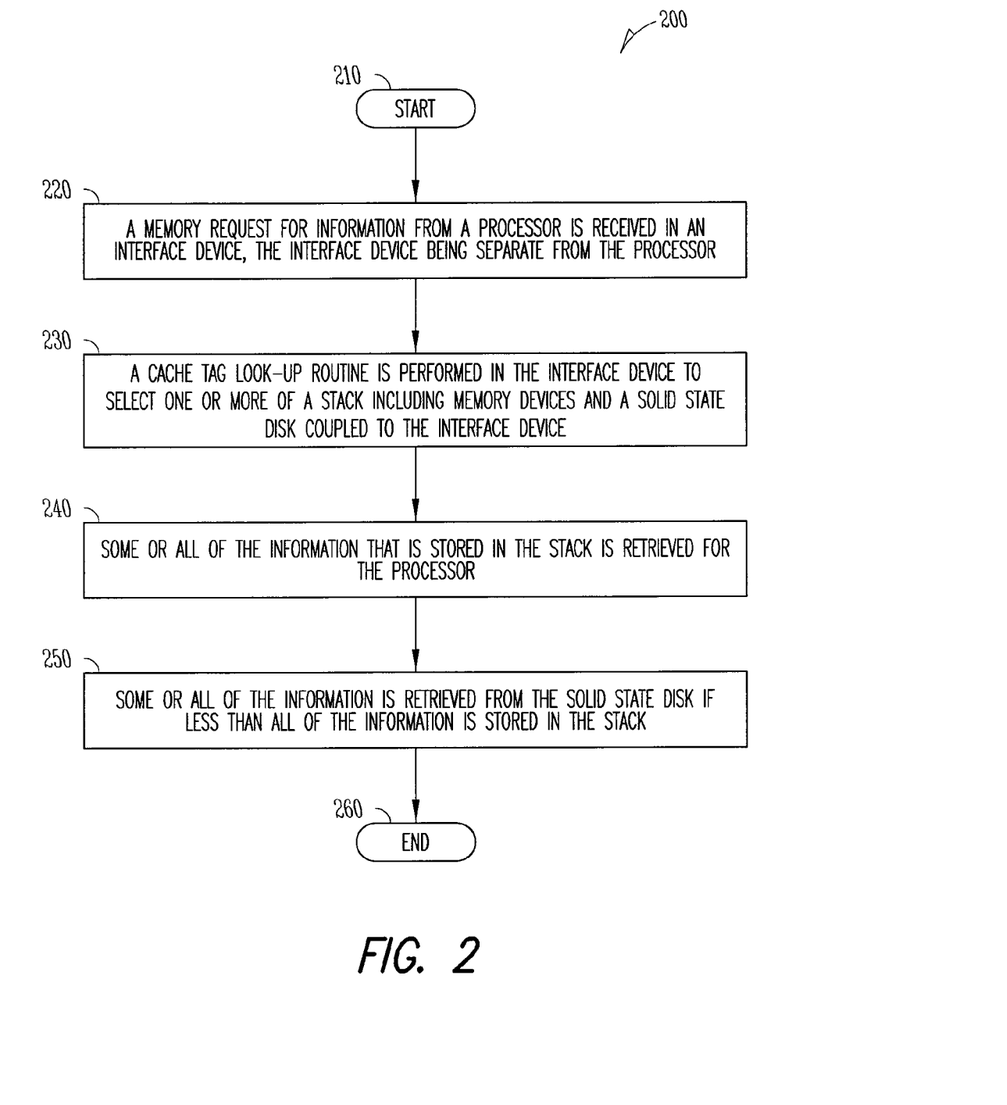
FIG. 2 is a flow diagram of a method according to various embodiments of the invention.

FIG. 2 is a flow diagram of a method 200 according to various embodiments of the invention. In block 210, the method 200 starts. In block 220, a memory request for information from a processor is received in an interface device, the interface device being separate from the processor. In block 230, a cache tag look-up routine is performed in the interface device to select one or more of a stack including memory devices and a solid state disk coupled to the interface device. In block 240, some or all of the information that is stored in the stack is retrieved for the processor. In block 250, some or all of the information is retrieved from the solid state disk if less than all of the information is stored in the stack. In block 260, the method 200 ends.

The individual activities of the method 200 do not have to be performed in the order shown or in any particular order. Some activities may be repeated, and others may occur only once. Various embodiments may have more or fewer activities than those shown in FIG. 2.

Figure 3:
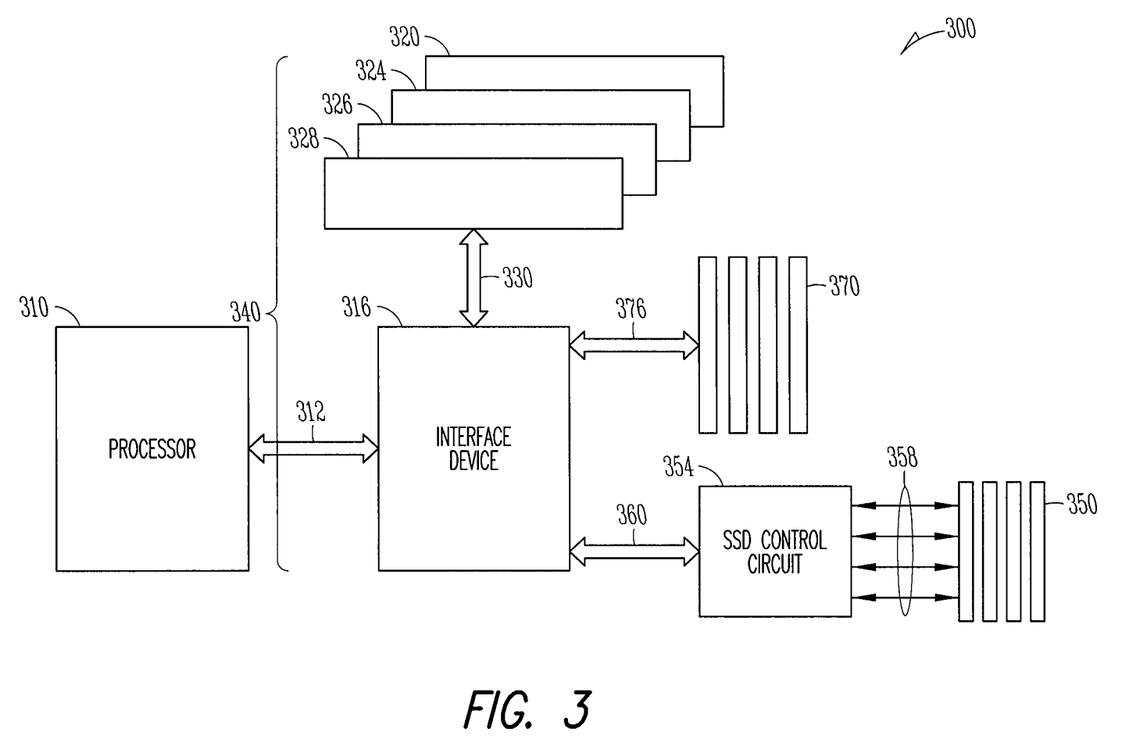
FIG. 3 is a block diagram of a system according to various embodiments of the invention.

FIG. 3 is a block diagram of a system 300 according to various embodiments of the invention. The system 300 includes a processor 310 coupled through a narrow high-speed bus 312 to an interface device 316. A collection of separate IC dice 320, 324, 326 and 328 are coupled to the interface device 316 through a wide bus 330 to transfer information between the interface device 316 and the IC dice 320, 324, 326 and 328. The interface device 316 is a separate IC die. The interface device 316, the bus 330 and the IC dice 320, 324, 326 and 328 are arranged in a stack 340.

Each of the IC dice 320, 324, 326 and 328 may be a memory device such as a DRAM device or a flash memory device. The IC dice 320, 324, 326 and 328 may communicate with each other through the bus 330 and with the processor 310 through the interface device 316. The stack 340 may include more or fewer IC dice according to various embodiments of the invention.

The system 300 includes a flash DIMM 350 coupled to a solid state drive (SSD) control circuit 354 through a number of bidirectional channels 358. The SSD control circuit 354 is coupled through a narrow high-speed bus 360 to the interface device 316. The system 300 also includes a DRAM DIMM 370 coupled through a bus 376 to the interface device 316.

The interface device 316, the flash DIMM 350, the DRAM DIMM 370 and the IC dice 320, 324, 326 and 328 are components of a tiered memory system in which the IC dice 320, 324, 326 and 328 are operated as a cache memory and the flash DIMM 350 and the DRAM DIMM 370 function as storage devices. The IC dice 320, 324, 326 and 328 may be partitioned into multiple types of memory including the cache memory according to various embodiments of the invention. Other memory devices (not shown) may be coupled to the interface device 316 to provide additional storage. The interface device 316 receives a memory request for information from the processor 310 and executes a cache tag look-up routine to retrieve the information and supply it to the processor 310. The information is retrieved from the IC dice 320, 324, 326 and 328, if stored there, and from storage devices such as the flash DIMM 350 and the DRAM DIMM 370 if some or all of the information is not located in the IC dice 320, 324, 326 and 328. A disk I/O routine is not performed by the processor 310. Cache tag values or LBA tables, or both, may be stored in the IC dice 320, 324, 326 and 328.

Figure 4:
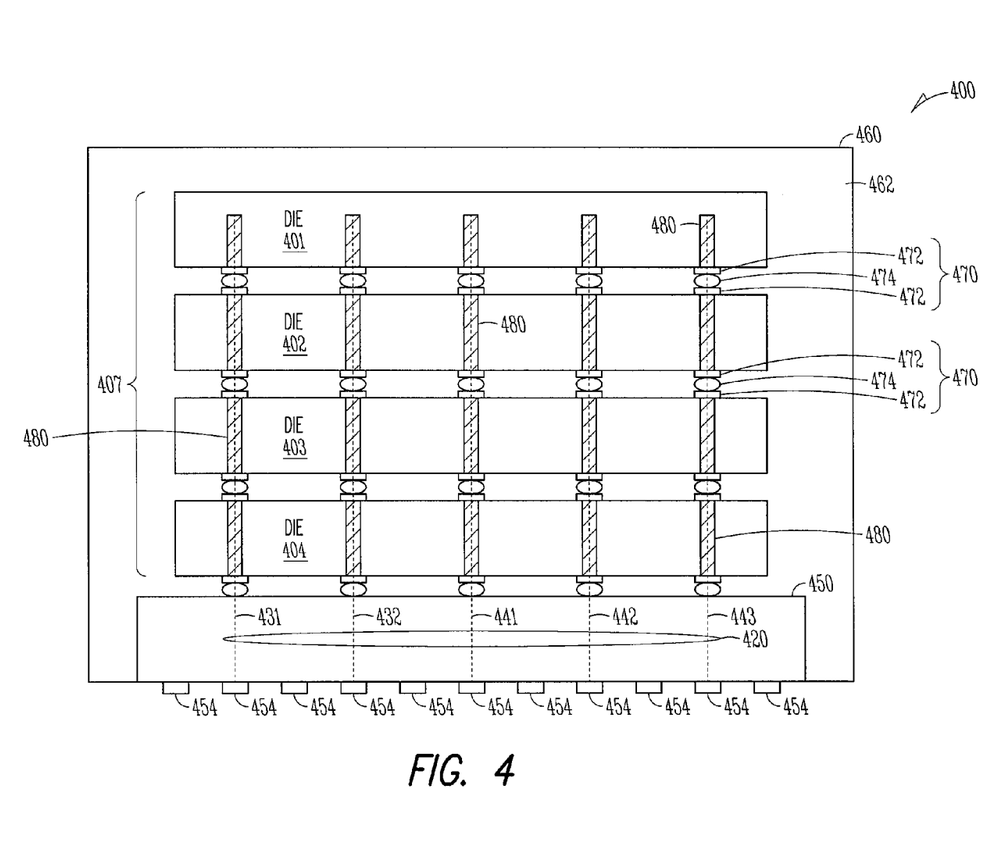
FIG. 4 is a partial cross section of an integrated circuit package having multiple separate integrated circuit (IC) dice arranged in a stack according to various embodiments of the invention.

FIG. 4 is a partial cross section of an integrated circuit package 400 having multiple separate IC dice 401, 402, 403 and 404 arranged in a stack 407 according to various embodiments of the invention. Each of the IC dice 401, 402, 403 and 404 is formed from a semiconductor material and includes electronic circuitry. The IC dice 401, 402, 403 and 404 may each include circuit components of a single memory device. Alternatively, the IC dice 401, 402, 403 and 404 collectively may include circuitry of a memory device. One of the IC dice 401, 402, 403 and 404 may include circuit components of an interface device according to various embodiments of the invention.

The package 400 includes a group 420 of channels 431, 432, 441, 442 and 443. Each channel 431, 432, 441, 442 and 443 is shown as a broken line in FIG. 4 that extends through or into the IC dice 401, 402, 403 and 404 in the stack 407. Each channel 431, 432, 441, 442 and 443 may be a conductive path and may be referred to as a "through wafer interconnect" (TWI) or a "through silicon via" (TSV).

The package 400 includes a support 450 coupled to the IC dice 401, 402, 403 and 404. The support 450 may be a ceramic or organic package substrate. Multiple contacts 454 are coupled to the support 450 to enable the IC dice 401, 402, 403 and 404 to communicate with another device such as a processor or a solid state disk (not shown). Some of the contacts 454 may form portions of the channels 431, 432, 441, 442 and 443. The package 400 includes an enclosure 460 which may enclose at least a part of the support 450 and the IC dice 401, 402, 403 and 404. An interior space 462 between the enclosure 460 and the IC dice 401, 402, 403 and 404 may be filled with a filling material, a gas, a liquid, or a combination thereof. The filling material may include a polymer material.

An interface device may be located in the die 404 and this interface device may be similar to or identical to the interface device 110 shown in FIG. 1 or the interface device 310 shown in FIG. 3. The interface device may include circuit components, such as buffers and I/O drivers, to facilitate the transfer of information at appropriate data transfer rates between the IC dice 401, 402 and 403 and another device such as a processor or a solid state disk (not shown).

The IC dice 401, 402, 403 and 404 can be substantially equal in size and are stacked vertically on, or with respect to, the support 450. In other words, the IC dice 401, 402, 403 and 404 are stacked along a line substantially perpendicular to a larger surface of the support 450.

The IC dice 401, 402, 403 and 404 may be formed separately and then arranged in the stack 407 as shown in FIG. 4. The IC dice 401, 402, 403 and 404 are attached to each other at a number of joints 470. Each joint 470 is located between two of the IC dice 401, 402, 403 and 404. Each joint 470 includes two bond pads 472, with one bond pad 472 being adhered to each respective die 401, 402, 403 and 404, and an electrically conductive material 474 between the bond pads 472. The conductive material 474 may include one or more of solder, copper, or a conductive adhesive.

Each channel 431, 432, 441, 442 and 443 includes at least one via 480 with a conductive material inside the via 480. A via 480 in one of the IC dice 401, 402, 403 and 404 is coupled to a via 480 in another one of the IC dice 401, 402, 403 and 404 through one of the joints 470 that couple distal ends of the vias 480 to each other. The vias 480 can extend all the way through some of the IC dice 402, 403 and 404 and extend into, but not through, another die, such as the die 401. The conductive material inside the vias 480 may include one or more of solder, copper, or another conductive material.

The group 420 of channels includes a specific number of channels as an example. The number of channels in the group 420 may vary. For example, the group 420 may include tens, hundreds, or thousands of channels extending through or into the IC dice 401, 402, 403 and 404. The channels in the group 420 enable high speed communication between the IC dice 401, 402, 403 and 404.

The stack 407 may be formed in a flip-chip fashion in which the die 401 is used as a base as shown in FIG. 4. The die 402 is attached to the die 401, the die 403 is then attached to the die 402, and finally the die 404 is attached to the die 403. The conductive material 474 is used to bond the bond pads 472 of one die to the bond pads 472 of another die while the IC dice 401, 402, 403 and 404 are assembled in the stack 307. After the IC dice 401, 402, 403 and 404 are assembled in the stack 407, they may be flipped over and then attached at the die 404 to the support 450. The package 400 may be assembled using other techniques according to various embodiments of the invention. The stack 407 may include more or fewer IC dice according to various embodiments of the invention.

Figure 5:
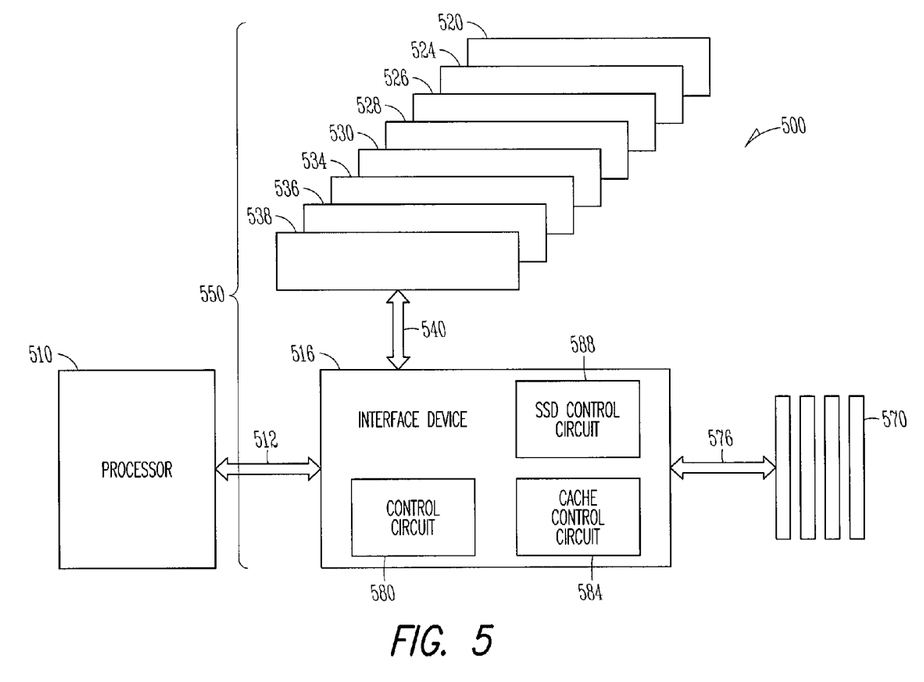
FIG. 5 is a block diagram of a system according to various embodiments of the invention.

FIG. 5 is a block diagram of a system 500 according to various embodiments of the invention. The system 500 includes a processor 510 coupled through a narrow high-speed bus 512 to an interface device 516. A collection of separate IC dice 520, 524, 526, 528, 530, 534, 536 and 538 are coupled to the interface device 516 through a wide bus 540 to transfer information between the interface device 516 and the IC dice 520, 524, 526, 528, 530, 534, 536 and 538. The interface device 516 is a separate IC die. The interface device 516, the bus 540 and the IC dice 520, 524, 526, 528, 530, 534, 536 and 538 are arranged in a stack 550.

Each of the IC dice 520, 524, 526, 528, 530, 534, 536 and 538 may be a memory device such as a DRAM device or a flash memory device. The IC dice 520, 524, 526, 528, 530, 534, 536 and 538 may communicate with each other through the bus 540 and with the processor 510 through the interface device 516. The stack 550 may include more or fewer IC dice according to various embodiments of the invention.

The system 500 also includes a DRAM DIMM 570 coupled through a bus 576 to the interface device 516. Information exchanged between the processor 110 and the DRAM DIMM 570 is controlled by a control circuit 580 in the interface device 116. Information exchanged between the processor 510 and the IC dice 520, 524, 526 and 528 is controlled by a cache control circuit 584 in the interface device 516. Information exchanged between the processor 510 and the IC dice 530, 534, 536 and 538 is controlled by a solid state drive (SSD) control circuit 588 in the interface device 516. The information exchanged between the processor 510, the IC dice 520, 524, 526, 528, 530, 534, 536 and 538 and the DRAM DIMM 570 includes one or more of data, address and control information or other information.

The interface device 516, the DRAM DIMM 570 and the IC dice 520, 524, 526, 528, 530, 534, 536 and 538 are components of a tiered memory system in which the IC dice 520, 524, 526 and 528 are operated as a cache memory and the IC dice 530, 534, 536 and 538 and the DRAM DIMM 570 function as storage devices. Other memory devices (not shown) may be coupled to the interface device 516 to provide additional storage. The interface device 516 receives a memory request for information from the processor 510 and executes a cache tag look-up routine to retrieve the information and supply it to the processor 510. The information is retrieved from the IC dice 520, 524, 526 and 528 if stored there, and from storage devices such as the IC dice 530, 534, 536 and 538 and the DRAM DIMM 570 if some or all of the information is not located in the IC dice 520, 524, 526 and 528. A disk I/O routine is not performed by the processor 510.

Cache tag values or LBA tables, or both, may be stored in the IC dice 520, 524, 526, 528, 530, 534, 536 and 538.

Figure 6:
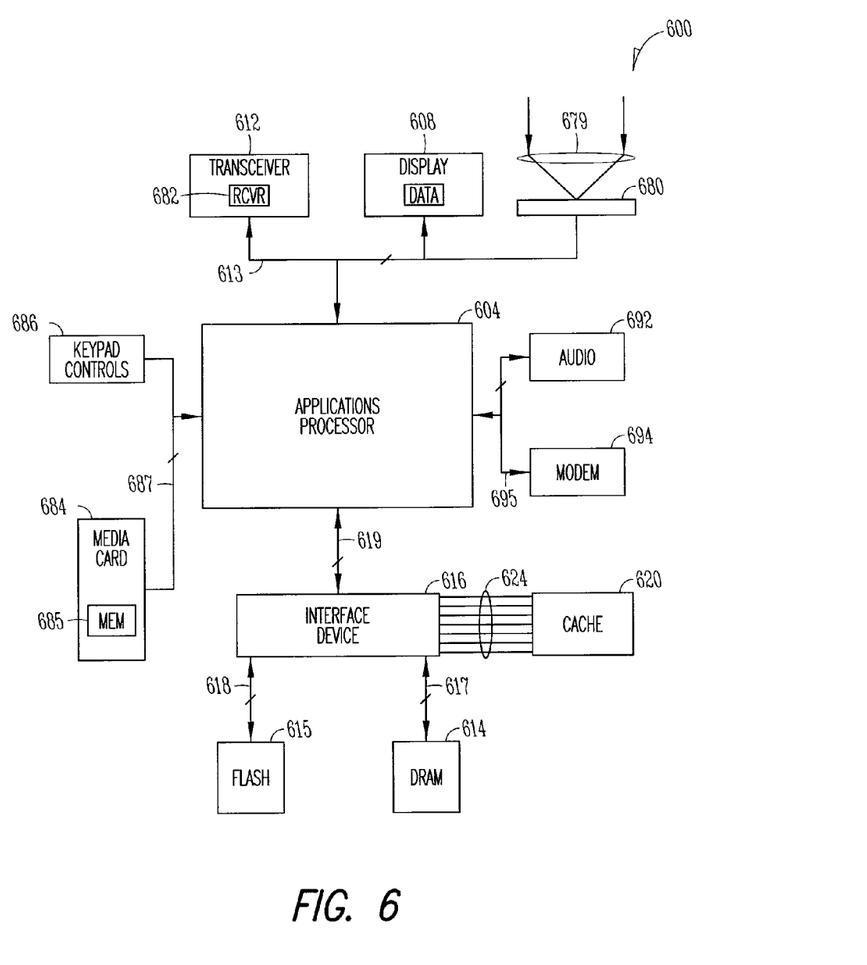
FIG. 6 is a block diagram of a system according to various embodiments of the invention.

FIG. 6 is a block diagram of a system 600 according to various embodiments of the invention. The system 600, in some embodiments, may include a processor 604 coupled to a display 608 and/or a wireless transceiver 612 through a bus 613. The display 608 may be used to display data, perhaps received by the wireless transceiver 612. The system 600 includes memory devices such as a DRAM DIMM 614 including a plurality of DRAM devices and/or a flash DIMM 615 including a plurality of flash memory devices. The flash DIMM 615 is a solid state disk. The DRAM DIMM 614 is coupled to exchange information with an interface device 616 over a bus 617. The flash DIMM 615 is coupled to exchange information with the interface device 616 over a bus 618. The processor 604 is coupled to exchange information with the interface device 616 over a bus 619. The DRAM devices in the DRAM DIMM 614 may be synchronous DRAM (SDRAM) devices.

The system 600 includes a cache memory device 620 with several separate IC dice (not shown). Each of the IC dice is a DRAM device or a flash memory device according to various embodiments of the invention. The cache memory device 620 and the interface device 616 are components of a stack that may be similar to the stack 120 shown in FIG. 1, the stack 340 shown in FIG. 3, the stack 407 shown in FIG. 4, or the stack 550 shown in FIG. 5. The cache memory device 620 is coupled to exchange information with the interface device 616 over a number of channels 624. Each of the channels 624 may be an electrically conductive path.

In some embodiments, the cache memory device 620 is a single memory device such as a DRAM device or a flash memory device coupled to exchange information with the interface device 616 through a bus (not shown).

In some embodiments, the system 600 may include a camera that includes a lens 679 and an imaging plane 680 to couple to the processor 604 through the bus 613. The imaging plane 680 may be used to receive light captured by the lens 679.

Many variations are possible. For example, in some embodiments, the system 600 may include a cellular telephone receiver 682 forming a pinion of the wireless transceiver 612. The cellular telephone receiver 682 may also receive data to be processed by the processor 604 and displayed on the display 608. In some embodiments, the system 600 may include an audio, video, or multi-media player 684, including a memory device 685 and a set of media playback controls 686 to couple to the processor 604 through a bus 687. The processor 604 may also be coupled to exchange information with an audio device 692 and/or a modem 694 through a bus 695.

Any of the electronic components of the system 600 may transmit data to other components of the system 600 according to embodiments of the invention described herein.

Systems including a processor and multiple memory devices presented herein may provide increased efficiency by performing a cache tag look-up routine in an interface device separate from the processor. The processor and its OS are not involved in retrieving information from the memory devices. The processor sees the interface device and the memory devices to be a single entity providing the information. This can lead to a significant performance improvement.

Any of the circuits or systems described herein may be referred to as a module. A module may comprise a circuit and/or firmware according to various embodiments.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the claims. In addition, in the foregoing Detailed Description, it can be seen that various features are arranged together for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of one or more of the disclosed embodiments. Thus, the following claims are hereby incorporated into the Detailed Description, with each claim standing on its own as a separate embodiment.

What is claimed is:

1. A system comprising:
   a processor;
   a stack including two or more memory devices;
   a storage device; and
   an interface device coupled to the processor, the storage device and the stack and structured to:
      receive a memory request for information from the processor;
      perform a cache tag look-up routine to select a device from the stack and the storage device; and
      retrieve at least a portion of the information from the selected device for the processor.

2. The system of claim 1, wherein the memory devices comprise a plurality of dynamic random access memory (DRAM) devices coupled to the interface device.

3. The system of claim 1, wherein the interface device is structured to:
   select the stack when some of the information is in the stack;
   select the storage device when all of the information is not in the stack;
   retrieve the information from the stack or the storage device; and
   transmit the information to the processor.

4. The system of claim 1, wherein:
   the storage device comprises a plurality of storage devices coupled to the interface device, wherein the interface device is structured to select the stack when some of the information is in the stack;
   select one or more of the storage devices having a shortest latency for the information from the plurality of storage devices when all of the information is not in the stack;
   retrieve the information from the stack or the one or more selected storage devices; and transmit the information to the processor.

5. The system of claim 1, wherein the storage device comprises:
   one or more solid state disks coupled to the interface device; and
   one or more dynamic random access memory (DRAM) devices coupled to the interface device.

6. The system of claim 1, wherein the stack is structured as a cache memory for the processor and comprises flash memory devices, or dynamic random access memory (DRAM) devices, or a flash memory device and a DRAM device.

7. A method comprising:
   sending a memory request for information from a processor to an interface device coupled to a stack including two or more memory devices; and
   receiving the information in the processor from the interface device after the interface device has performed a cache tag look-up routine to select a device from a storage device and the stack;
retrieved some or all of the information from the stack when some of the information was in the stack;
retrieved some or all of the information from the storage device when less than all of the information was in the stack; and
transmitted the information to the processor.

8. The method of claim 7, wherein the interface device had retrieved some or all of the information from a solid state disk comprising the storage device when less than all of the information was in the stack.

9. The method of claim 7, wherein the interface device had retrieved some or all of the information from the stack comprising flash memory devices, or dynamic random access memory (DRAM) devices, or a flash memory device and a DRAM device when some of the information was in the stack.

10. A method comprising:
receiving a memory request for information in an interface device coupled to a stack including two or more memory devices, the memory request being received from a processor;
performing a cache tag look-up routine in the interface device to select a device from one or more storage devices and the stack; and
retrieving at least a portion of the information from the selected stack or storage device for the processor.

11. The method of claim 10, wherein performing the cache tag look-up routine includes selecting one or more of the stack and the one or more storage devices having a shortest latency for the information.

12. The method of claim 10, wherein:
performing the cache tag look-up routine includes determining when the information is in the stack; and
wherein the retrieving at least a portion of the information includes
retrieving a first portion of the information from the stack when the first portion of the information is in the stack; and
retrieving a remaining portion of the information from the one or more storage devices when all of the information is not in the stack.

13. The method of claim 10, wherein:
the retrieving at least a portion of the information includes
retrieving a first portion of the information from a plurality of dynamic random access memory (DRAM) devices in the stack when the first portion of the information is in the stack; and
retrieving a remaining portion of the information from the one or more storage devices comprising a flash memory device and a DRAM device when all of the information is not in the stack; and
further comprising transmitting the information from the interface device to the processor.

14. The method of claim 10, further comprising storing cache tag values or logical block address (LBA) tables in the stack.

15. A system comprising:
a processor;
a stack including two or more memory devices; and
an interface device coupled to the processor and the stack and structured to
receive a memory request for information from the processor;
perform a cache tag look-up routine to select a device from one or more storage devices and the stack; and
retrieve at least a portion of the information from the selected device for the processor.

16. The system of claim 15, wherein the interface device is structured to:
select the stack when some of the information is in the stack;
select one or more of the storage devices having a shortest latency for the information from the one or more storage devices when all of the information is not in the stack; and
retrieve the information from the stack or the one or more selected storage devices for the processor.

17. The system of claim 15, wherein the interface device is structured to:
retrieve the information from the stack when the information is in the stack;
retrieve the information from the one or more storage devices when the information is not in the stack; and
transmit the information to the processor.

18. The system of claim 15, wherein the interface device is structured to transmit the information from the interface device to the processor.

19. The system of claim 15, wherein:
the one or more storage devices include one or more of
a flash memory device coupled to the interface device; and
a dynamic random access memory (DRAM) device coupled to the interface device; and
the stack includes
a plurality of DRAM devices; and
a plurality of through silicon vias coupled to the DRAM devices and the interface device to carry signals between the DRAM devices and the interface device.

20. The system of claim 15, wherein the stack is structured as a cache memory for the processor and includes flash memory devices, or dynamic random access memory (DRAM) devices, or a flash memory device and a DRAM device.

21. A method comprising:
receiving a memory request for information in an interface device coupled to a stack including two or more memory devices, the memory request being received from a processor; and
operating the interface device to
perform a cache tag look-up routine to select a device from one or more storage devices and the stack; and
retrieve at least a portion of the information from the selected stack or one or more storage devices for the processor.

22. The method of claim 21, wherein operating the interface device further comprises operating the interface device to:
select the stack when the at least a portion of the information is in the stack; and
select one or more of the one or more storage devices having a shortest latency for the information when all of the information is not in the stack.

23. The method of claim 21, wherein operating the interface device includes operating the interface device to:
determine when the information is in the stack;
retrieve the information from the stack when the information is in the stack;
retrieve the information from the one or more storage devices when the information is not in the stack; and
transmit the information from the interface device to the processor.

24. The method of claim 21, further comprising storing cache tag values or logical block address (LBA) tables in the stack.

25. The method of claim 22, wherein operating the interface device further comprises operating the interface device to select at least one of the one or more storage devices comprising solid state disk when all of the information is not in the stack.

* * * * *